United States Patent
Pautrat et al.

[11] Patent Number: 6,013,912
[45] Date of Patent: Jan. 11, 2000

[54] MULTISPECTRAL SEMICONDUCTOR RESONANT-CAVITY DETECTOR SENSITIVE IN AT LEAST TWO WAVELENGTH BANDS

[75] Inventors: Jean-Louis Pautrat, Grenoble; Noël Magnea, Moiraus; Emmanuel Hadji, Grenoble, all of France

[73] Assignee: Commissariat a l'Energie Atomique, France

[21] Appl. No.: 08/969,459

[22] Filed: Nov. 13, 1997

[30] Foreign Application Priority Data

Nov. 19, 1996 [FR] France .................................. 96 14093

[51] Int. Cl.$^7$ ........................................................ G01J 3/50
[52] U.S. Cl. ........................ 250/226; 250/214.1; 359/248; 372/45
[58] Field of Search ................................. 250/226, 214.1, 250/214 LS; 372/45, 46, 43, 22, 23, 26; 359/248, 247, 346

[56] References Cited

U.S. PATENT DOCUMENTS

| | | |
|---|---|---|
| 4,956,686 | 9/1990 | Borrello et al. . |
| 5,113,076 | 5/1992 | Schulte ................................ 250/370.06 |
| 5,414,726 | 5/1995 | Raj et al. .................................. 372/45 |
| 5,455,421 | 10/1995 | Spears .................................. 250/338.4 |
| 5,802,086 | 9/1998 | Hargis et al. .............................. 372/22 |

FOREIGN PATENT DOCUMENTS 0 622 856   2/1994   France .

OTHER PUBLICATIONS

Katsumi Kishino et al., "Resonant Cavity–Enhanced (RCE) Photodetectors", from the issue of IEEE Journal of Quantum Electronic Aug. 27, 1991, vol. 27, No. 8, pp. 2025–2034.

A. Srinivasan et al., "High quantum efficiency dual wavelength resonant–cavity photodetector", from the issue of Applied Physics Letters, Jan. 30, 1995, vol. 66, No. 5, pp. 535–537.

J. A. Wilson et al., "Integrated Two–Color Detection for Advanced FPA Applications", from the issue Proceedings of the Spie, Jul. 1994, vol. 2274, pp. 117–118.

*Primary Examiner*—Que T. Le
*Attorney, Agent, or Firm*—Burns, Doane, Swecker & Mathis, L.L.P.

[57] ABSTRACT

A multispectral resonant-cavity detector is formed of at least one cavity (2) resonating at not less than two wavelengths and containing at least two layers (12, 14) that absorb the corresponding radiation and are placed at antinodes specific to stationary waves in the cavity, the cavity having at least two P-N junctions at whose space charge zones the layers are disposed. For each cavity, there are at least two electrical contacts to polarize the two junctions inversely to each other to detect the corresponding radiation.

6 Claims, 3 Drawing Sheets

6,013,912

MULTISPECTRAL SEMICONDUCTOR RESONANT-CAVITY DETECTOR SENSITIVE IN AT LEAST TWO WAVELENGTH BANDS

TECHNICAL FIELD

This invention relates to a multispectral resonant-cavity detector.

It is a radiation detector based on semiconductors, and is sensitive in at least two spectral bands.

The invention is particularly applicable to the case in which the two spectral bands are in the infrared range.

It has many applications, particularly for object identification and thermal imagery.

STATE OF PRIOR ART

Semiconductor materials II–VI with a prohibited band adapted to the radiation to be absorbed are frequently used to detect infrared radiation within the range from 1 to 10 $\mu$m.

A number of solutions have been suggested in the past for absorbing several wavelengths within a single device.

A first solution is to place a number of materials side by side, each sensitive to a specific wavelength.

Document (1) describes this subject, and like all other documents mentioned below, is included in the references at the end of this description.

This known solution can be used to make detector matrices, but in this case each pixel is shared in several areas (one for each wavelength).

Therefore, each of these areas can only absorb a fraction of the incident radiation falling on its surface, which limits the efficiency of the detector.

A second solution is to place a number of materials on top of each other, each sensitive to a wavelength.

Different structures are possible.

The most attractive solution for detecting two different wavelengths is to have an NPN structure in which each N-type zone contains an active layer sensitive to a wavelength.

Document (2) describes this subject.

In this type of component, two wavelengths can be detected simultaneously or sequentially, depending on whether one or two contacts per pixel are available, in addition to the contact common to the entire network.

Document (3) describes this subject.

Unfortunately, this type of component must be quite thick in order to absorb a sufficient fraction of infrared photons.

These known devices, which have a large active thickness, are slow and can only operate at low temperatures due to thermal noise generated within the active volume when the temperature tends to approach the ambient temperature.

Furthermore, the wavelength selectivity is limited by the width of the active layer absorption band.

It is also known that the possibility of reinforcing the absorption of an active layer by placing it within a microcavity has been demonstrated in the near infrared range.

The authors of this invention have checked it experimentally within the wavelength band between 3 to 5 $\mu$m.

Furthermore, detectors with microcavities sensitive to two different wavelengths have been suggested recently.

Document (4) describes this subject.

The structure of these known detectors consists of a single active layer located inside a microcavity capable of resonating at two different wavelengths.

These known detectors have two disadvantages.

Firstly, the two detected wavelengths cannot be electrically separated because they are absorbed in a single active layer.

Secondly, the quantum efficiency of these detectors is not the same for the two wavelengths since the absorption coefficient of the active layer varies with the wavelength.

Document (5) also describes a photodetector including two detectors placed at fixed distances from a mirror in order to create a stationary wave pattern starting from incident light. In principle, this photodetector detects a pair of wavelengths for which the absorbent environments of detectors would be placed on the antinodes of the stationary wave. However, if light with different wavelengths propagates simultaneously in the photodetector, this light would be absorbed more or less intensely on the two detectors, and also unpredictably if the wavelengths and intensity of this light is not known. This would confuse the response of the photodetector, which therefore would not necessarily work. This known photodetector is not selective for two wavelengths.

Document (6) also describes a photodetector comprising a photodiode which is designed to absorb radiation with a given wavelength and which is placed in a resonant cavity. It is also planned to place several photodetectors adjacent to each other, matched on different wavelengths to detect these wavelengths.

However, the light power reaching each photodetector is reduced by a factor of n, where n is the number of photodetectors. Furthermore, putting the photodetectors adjacent to each other does not guarantee that the n photodetectors will see the same light source.

DESCRIPTION OF THE INVENTION

The purpose of this invention is to overcome the above disadvantages.

Its purpose is a multispectral detector that comprises at least one resonant cavity in thin layers and in which the colors are electrically separated at each resonant cavity.

Each resonant cavity is designed to resonate at two or more wavelengths.

In each cavity, the fact that stationary waves specific to the different resonant wavelengths are set up, is used to separate these wavelengths.

Consequently, absorbent layers are placed on antinodes specific to these stationary waves.

P-N junctions that contain absorbent layers in their space charge areas, collect the photocurrent generated by the light.

A detector conform with the invention may comprise a set of resonant cavities forming a detection matrix, each resonant cavity corresponding to a pixel.

The precise purpose of this invention is a multispectral detector, characterized in that it comprises at least one resonant cavity designed to resonate at at least two wavelengths, stationary waves specific to these wavelengths are set up to separate these wavelengths, and in that this resonant cavity contains at least two absorbent layers which are associated with and adapted to each of these wavelengths respectively, in order to absorb the radiation corresponding to these wavelengths respectively, and which are placed at the antinodes specific to these stationary waves, and in that this cavity also contains at least two P-N junctions, the absorbent layers being placed in the space charge areas of these junctions respectively, and in that the detector also comprises at least two electrical contacts for each cavity, in order to polarize the two P-N junctions in opposite directions, to detect the corresponding radiation.

Preferably, the detector according to the invention comprises three electrical contacts for each resonant cavity, capable of inversely polarizing the two P-N junctions to simultaneously detect the corresponding radiation.

According to a specific embodiment of the detector according to the invention, each resonant cavity is delimited by a first mirror and by a second mirror that allows the radiation to be detected to pass, and in that the first mirror is chosen from the group that consists of Bragg mirrors, multilayer dielectric mirrors and metallic films.

The second mirror may be chosen among the group that consists of Bragg mirrors and multilayer dielectric mirrors.

As a variant, the second mirror is composed of the resonant air-cavity interface.

As we have seen above, the detector according to the invention may include a set of resonant cavities with a matrix structure.

With the detector according to the invention:
thin active layers may be used due to the fact that absorption is reinforced by the resonance effect, the reduction in the active volume enabling operation at a higher temperature than is possible in known devices mentioned above, selective two color detection is possible by the intrinsic effect of the resonant cavity, without the addition of supplementary filters, and electrical signals corresponding to the different detected wavelengths can be separated for each pixel.

BRIEF DESCRIPTION OF THE FIGURES

This invention will be better understood by referring to the attached drawings while reading the description of embodiment examples that are given below for information only and are in no way limitative. In these Figures.

DETAILED DESCRIPTION OF SPECIFIC EMBODIMENTS

Figure 1:
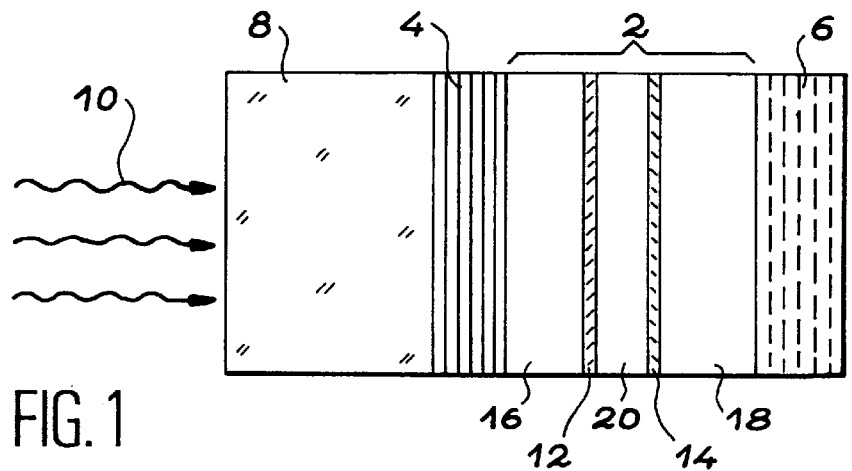
FIG. 1 is a schematic sectional view of a particular embodiment of the multispectral detector according to the invention, with a resonant cavity in which one of the two mirrors is an epitaxial Bragg mirror.

The multispectral detector according to the invention for which a schematic sectional view is shown in FIG. 1, is designed to detect radiation with wavelengths $\lambda_1$ and $\lambda_2$ respectively.

This detector comprises a resonant cavity 2 which is a Fabry-Pérot cavity and is delimited by two mirrors 4 and 6.

The cavity 2 and the two mirrors 4 and 6 that delimit this cavity are formed on a monocrystalline semiconductor substrate 8 which is transparent to radiation to be detected, this radiation being marked reference 10 in FIG. 1.

This radiation penetrates through the lower surface of the substrate before reaching the resonant cavity of the detector.

Mirror 4 forms the lower mirror of the detector, while the mirror 6 forms the upper mirror of this detector.

Cavity 2 is designed to resonate at the two wavelengths $\lambda_1$ and $\lambda_2$.

Stationary waves specific to these wavelengths $\lambda_1$ and $\lambda_2$ are set up in cavity 2 to separate these wavelengths.

The resonant cavity 2 contains two absorbent layers 12 and 14 which are associated with and adapted to these wavelengths $\lambda_1$ and $\lambda_2$ respectively, so as to absorb radiation with wavelength $\lambda_1$ (layer 12), and radiation with wavelength $\lambda_2$ (layer 14), respectively.

The resonant cavity 2 also contains two P-N junctions.

FIG. 1 shows a P type semiconducting layer 16, another P type semiconducting layer 18, and an N type semiconducting layer 20 between layers 16 and 18.

This forms two P-N junctions.

The absorbing layer 12 is placed in the space charge area of the junction formed by layers 16 and 20.

The absorbing layer 14 is placed in the space charge area of the junction formed by layers 18 and 20.

Absorbing layers 12 and 14, that can also be called active layers, and layers 16, 18 and 20, are thin semiconducting layers, and must have a required thickness so that the total thickness of layers 16, 12, 20, 14 and 18 produces resonance of the cavity at wavelengths $\lambda_1$ and $\lambda_2$.

The resonant cavity 2 is formed by epitaxy on the monocrystalline semiconductor substrate 8. The upper mirror 6 may be:

a Bragg mirror formed by epitaxy on layer 18 or a dielectric multilayer structure deposited on this layer 18, or, a metallic film deposited on this layer 18.

In the example in FIG. 1, the lower mirror 4 is a Bragg mirror formed by epitaxy on the substrate 8 before formation of the resonant cavity.

Figure 2:
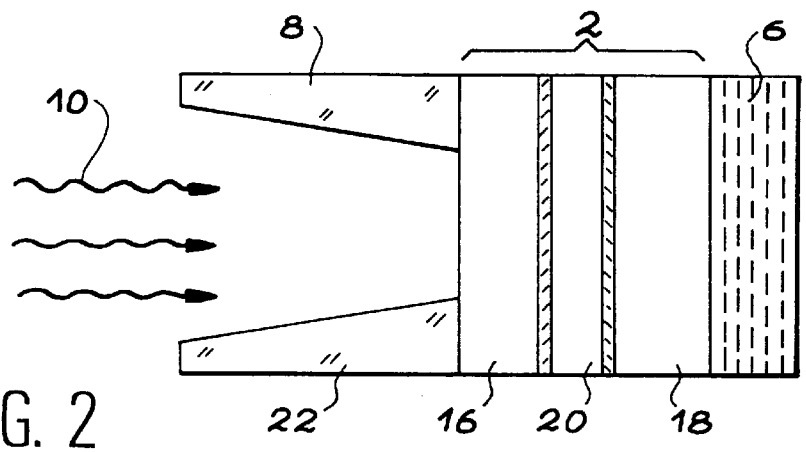
FIG. 2 is a schematic sectional view of another specific embodiment, in which the mirror is simply composed of the interface between the air and the semiconducting material in which the resonant cavity is located.

In the example shown in FIG. 2, a drilling 22 is formed in cavity 2, in substrate 8, by etching this substrate 8, thus creating an interface between the air and the semiconductor material which forms layer 16.

The lower mirror 4 is then composed of this interface.

Figure 3:
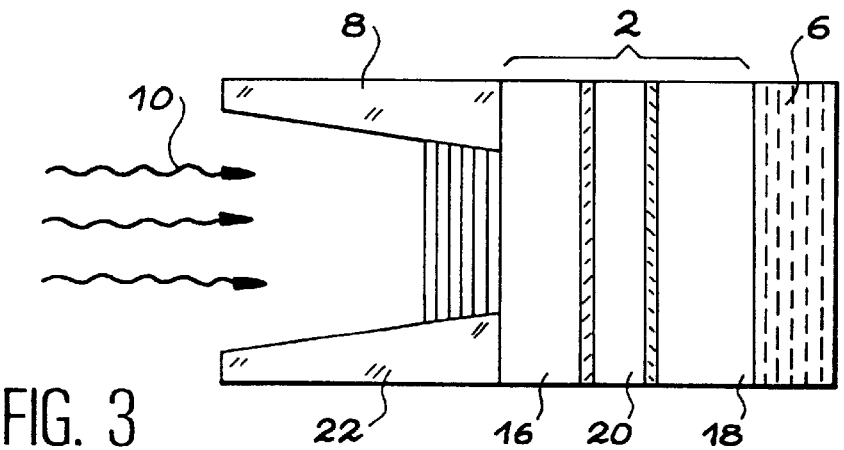
FIG. 3 is a schematic sectional view of another specific embodiment, in which this mirror consists of a deposit of dielectric multilayers.

In the example in FIG. 3, the semiconductor substrate 8 is etched once again to form the drilling 22 in cavity 2, and a dielectric multilayer deposit is formed at the bottom of the cavity thus obtained.

This deposit of dielectric multilayers, which is in contact with the semiconducting layer 16, then forms the lower mirror 4 of the resonant cavity.

Figure 4:
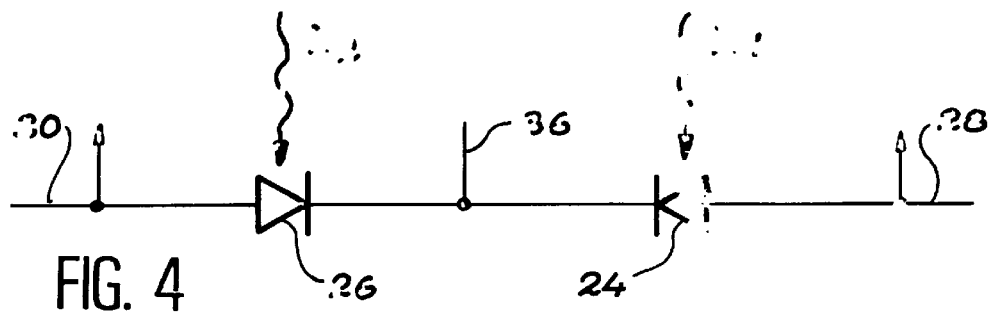
FIG. 4 is an electrical diagram of a detector according to the invention, of the type shown in FIGS. 1 to 3, FIG. 5 schematically illustrates the band diagram for these detectors in FIGS. 1 to 3, FIG. 6 schematically illustrates the stationary waves and absorbent layers in the resonant cavity of detectors in FIGS. 1 to 3.

FIG. 4 shows the electrical diagram of the detector according to the invention, for which the alternatives are shown in FIGS. 1 to 3.

It can be seen that this detector contains two photodetecting diodes 24 and 26.

Diode 24 is associated with the P-N junction formed by layers 16 and 20, and diode 26 is associated with the P-N junction formed by layers 18 and 20.

FIG. 4 shows that this detector also comprises two electrical contacts 28 and 30.

The diode cathodes are connected to each other, and the electrical contact 28 (or the upper contact) is connected to the anode of diode 24 which is designed to detect radiation with wavelength $\lambda_1$, whereas the contact 30 (or the lower contact) is connected to the anode of diode 26 which is designed to detect the radiation of wavelength $\lambda_2$.

These electrical contacts are not shown in FIGS. 1 to 3, but it is specified that the electric contacts 28 and 30 corresponding to the resonant cavity that can be seen in FIGS. 1 to 3 are placed in the upper part of this cavity (on the side of layer 10 with P type doping) and in the lower part of this cavity (on the side of layer 16 which also has a P type doping) respectively.

Figure 5:
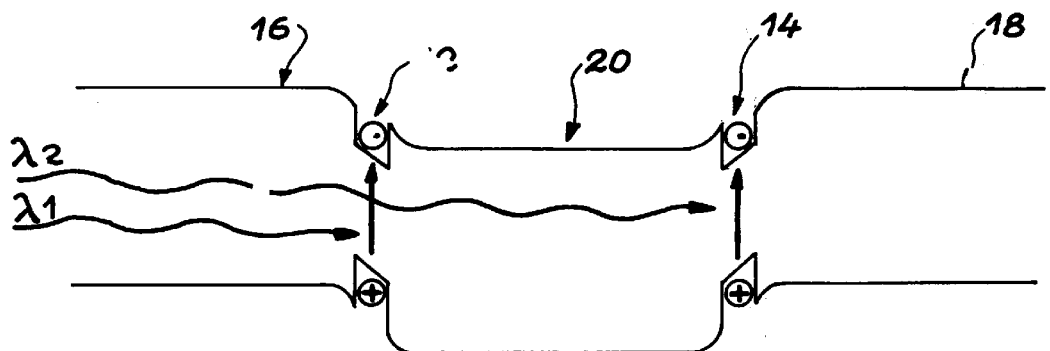

FIG. 5 shows the diagram of bands corresponding to layers 12, 14, 16, 18 and 20.

Note that the active layer 12, the composition of which is adapted to the wavelength $\lambda_1$ that it must detect, is placed in the resonant cavity 2, on a low point of the stationary wave specific to this wavelength $\lambda_1$.

Similarly, the active layer 14, the composition of which is adapted to the wavelength $\lambda_2$ that it is to detect, is placed in the resonant cavity 2, on the low point of the stationary wave specific to this wavelength $\lambda_2$.

Figure 6:
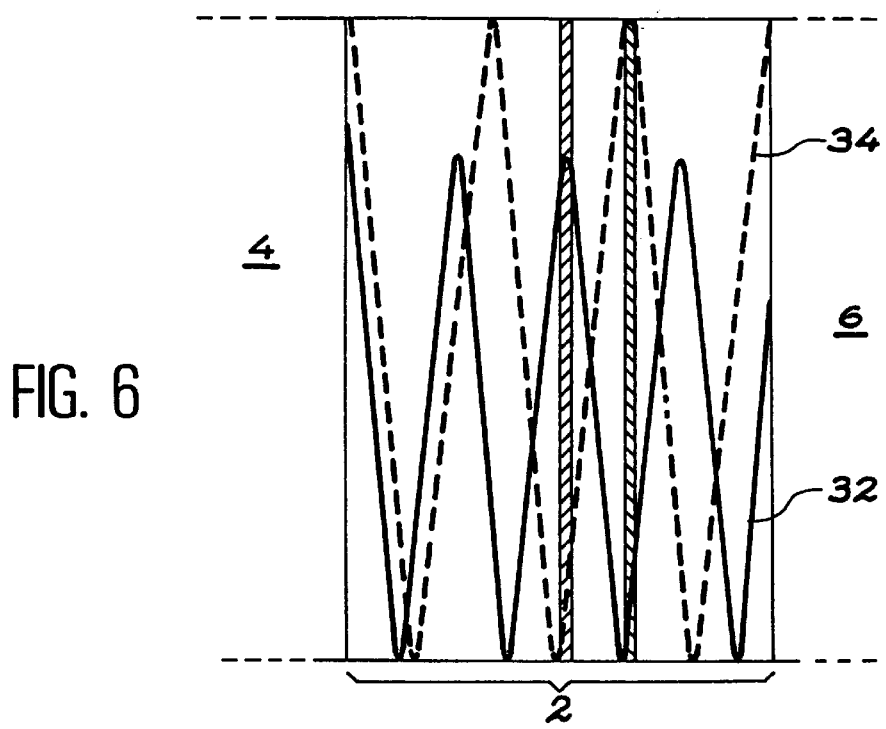

FIG. 6 shows the position of active layers 12 and 14 for cavity 2 (which resonates at wavelengths $\lambda_1$ and $\lambda_2$).

In the example shown in FIG. 6, $\lambda_1$ is equal to 3.04 $\mu$m and $\lambda_2$ is equal to 3.91 $\mu$m.

FIG. 6 also shows the stationary wave 32 corresponding to the wavelength $\lambda_1$, and the stationary wave 34 corresponding to wavelength $\lambda_2$.

The operation of the detectors shown in FIGS. 1 to 3 is explained below.

The only radiation that penetrates into resonant cavity 2 is incident radiation with resonant wavelengths $\lambda_1$ and $\lambda_2$.

Due to its position in the cavity, each active layer 12 or 14 only "sees" one wavelength.

Light is absorbed very efficiently (due to resonance) in the active layers and creates pairs of electronic charges.

The light with wavelength $\lambda_2$ is absorbed in the upper P-N junction corresponding to layers 18 and 20, and the light with wavelength $\lambda_2$ is absorbed in the lower P-N junction corresponding to layers 16 and 20.

When the upper electric contact 28 is increased to a suitable positive electrical potential with respect to the lower electrical contact 30, the upper P-N junction is directly polarized whereas the lower P-N junction is inversely polarized.

In this case, the current $i_1$ (FIG. 4) output from the detector (at the electrical contact 30) is controlled by absorption in the lower junction.

Therefore this current $i_1$ is proportional to the intensity of the light of wavelength $\lambda_1$.

Conversely, when the lower electrical contact 30 is increased to a suitable positive potential with respect to the upper electrical contact 28, the lower P-N junction is directly polarized whereas the upper P-N junction is inversely polarized.

In this case, the current $i_1$ (FIG. 4) output from the detector (at the electrical contact 28) is proportional to the intensity of light of wavelength $\lambda_2$.

Figure 7:
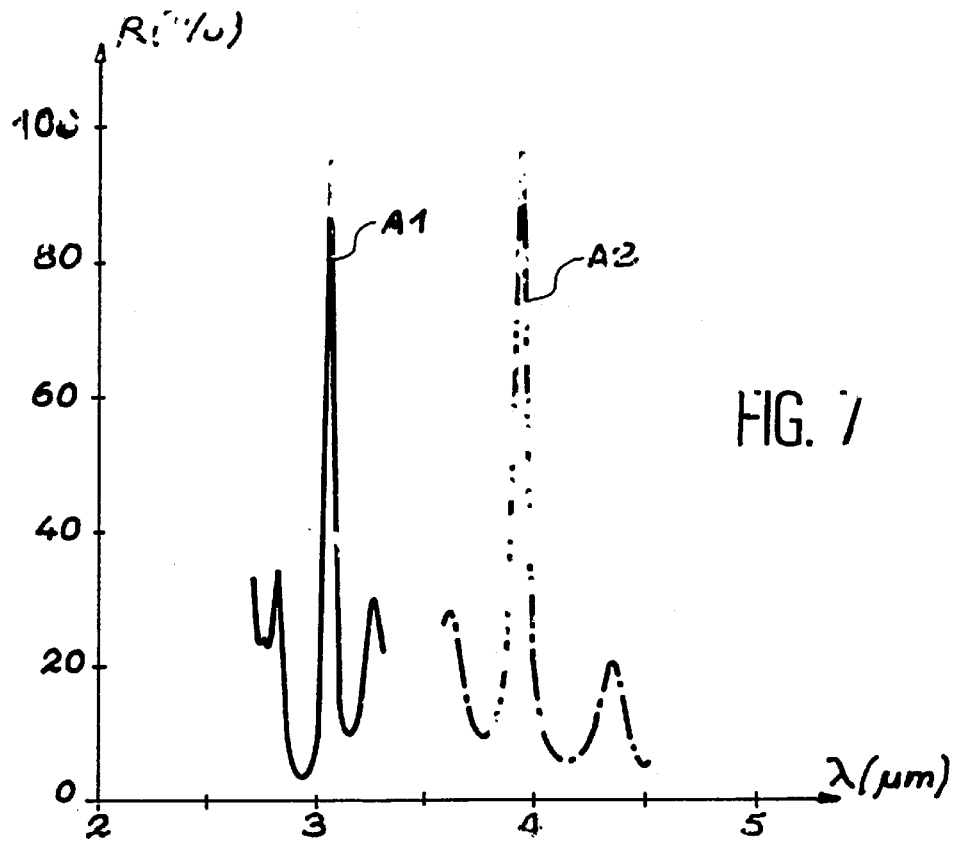
FIG. 7 represents the response variations of these detectors in FIGS. 1 to 3 as a function of the wavelength.

FIG. 7 shows the spectral response R (expressed as a percentage) as a function of the wavelength $\lambda$ (expressed in micrometers).

This spectral response is calculated for the two-color system corresponding to wavelengths $\lambda_1=3.04$ $\mu$m and $\lambda_2=3.91$ $\mu$m, depending on the polarization.

FIG. 7 shows a first curve A1 corresponding to a first polarization for detection of light of wavelength $\lambda_1$.

It also shows a curve A2 corresponding to a second polarization for the detection of light of wavelength $\lambda_2$.

Therefore, operation of the detector separates these two detected wavelengths sequentially.

However, an additional electrical contact 36 could be provided (FIG. 4) in the semiconducting layer 20 with N type doping to polarize the two P-N junctions inversely at the same time, and therefore to simultaneously detect the two wavelengths $\lambda_1$ and $\lambda_2$.

In this case, the electrical contacts 28 and 30 are simultaneously increased to suitable negative potentials with respect to the electrical contact 36.

Figure 8:
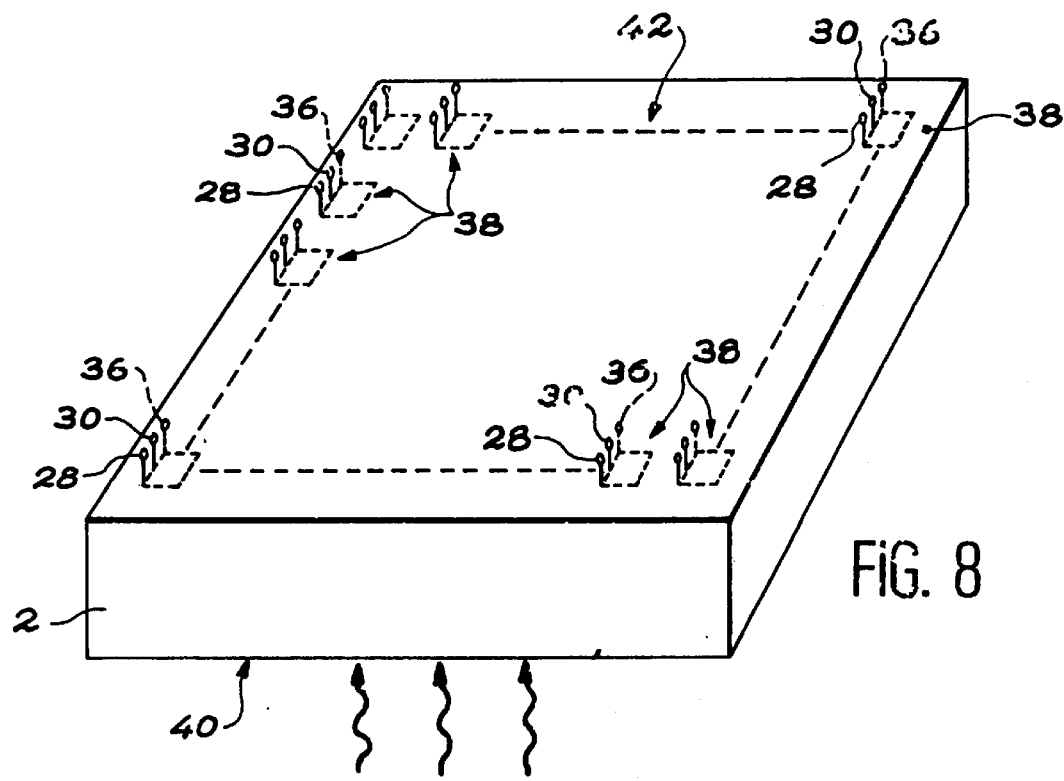
FIG. 8 is a schematic and partial perspective view of a multispectral detector according to the invention, comprising a set of resonant cavities of the type shown in FIGS. 1 to 3.

FIG. 8 schematically illustrates another multispectral detector in accordance with the invention, comprising a set of elementary detectors 38.

Each of these elementary detectors comprises a resonant cavity of the type shown in FIG. 1 or 2 or 3 (delimited by two mirrors and formed on a monocrystalline semiconducting substrate 2).

All these cavities, and therefore these elementary detectors, have a matrix structure as can be seen in FIG. 8.

Radiation to be detected still arrives through the lower surface 40 of substrate 2 (common to all elementary detectors).

The electrical contacts 28 and 30, and possibly the electrical contact 36 associated with each elementary detector 38, terminate on the upper surface 42 of the detector (surface opposite the surface through which the radiation to be detected arrives).

It is thus possible to detect images at wavelengths $\lambda_1$ and $\lambda_2$.

Each resonant cavity, and therefore each elementary detector 38, corresponds to a pixel.

To obtain the image at wavelength $\lambda_1$, the pairs of contacts 28, 30 are appropriately polarized in sequence as explained above, to obtain currents $i_1$ corresponding to these pixels and to form this image at wavelength $\lambda_1$.

These pairs of contacts 28, 30 are then appropriately polarized as explained above, to successively obtain currents $i_2$ corresponding to the pixels, and used to form the image at wavelength $\lambda_2$.

When the electric contacts 36 are present, the contact triplets 28, 30, 36 can be polarized as explained above to obtain the image at wavelength $\lambda_1$ and the image at wavelength $\lambda_2$ simultaneously.

Obviously, resonant cavities each containing an N-P-N type stack could be used instead of resonant cavities each containing a P-N-P type stack, (layer 16 then being of type N, layer 20 type P and layer 18 type N).

Appropriate electrical polarizations, that can be determined by an expert in the field, could also be used to obtain images at wavelengths $\lambda_1$ and images at wavelength $\lambda_2$.

In a specific embodiment not shown, each resonant cavity contains more than two active layers, instead of only two active layers, which are placed in each of the space charge zones of the P-N junctions so as to be able to detect more than two wavelengths.

Resonant cavities can thus be made each containing a succession of P type semiconducting layers which alternate with N type semiconducting layers, and the active layers corresponding to the various wavelengths can be placed in the space charge zones of the P-N junctions thus obtained, respectively.

The following documents are mentioned in this description:

(1) U.S. Pat. No. 4,956,686 (Borrello et al.)
(2) U.S. Pat. No. 5,113,076 (Schulte)

(3) "Integrated two-color detection for advanced FPA applications", J. A. Wilson et al., SPIE San Diego, July 24 to 29 1994, pp 1 to 9

(4) "High quantum efficiency dual wavelength resonant-cavity photodetector", A. Srinivasan et al., Appl. Phys. Lett., 66 (5), Jan. 30 1995, pp 535 to 537

(5) EP 0622856A (AT&T Corp)

(6) IEEE Journal of Quantum Electronics vol. 27, No. 8, Aug. 1 1991, pages 2025 to 2034.

It is claimed:

1. Multispectral detector characterized in that it comprises at least one resonant cavity (2) designed to resonate at at least two wavelengths, stationary waves specific to said at least two wavelengths being set up to separate said at least two wavelengths, in that said resonant cavity contains at least two absorbent layers (12, 14) which are associated with and adapted to said at least two wavelengths respectively in order to absorb the radiation corresponding to said at least two wavelengths and which are placed on the antinodes specific to each of said stationary waves, in that said resonant cavity also contains at least two P-N junctions, the absorbent layers being placed in the space charge areas of said junctions respectively, and in that said detector also comprises at least two electrical contacts (28, 30, 36) for each cavity, in order to polarize the two P-N junctions inversely to each other to detect the corresponding radiation.

2. Detector according to claim 1, characterized in that the detector comprises three electrical contacts (28, 30, 36) for each resonant cavity in order to polarize the two P-N junctions inversely to detect the corresponding radiation simultaneously.

3. Detector according to claim 1, characterized in that each resonant cavity (2) is delimited by a first mirror (6) and by a second mirror (4) that allows the radiation to be detected to pass, and in that the first mirror (6) is chosen from the group consisting of Bragg mirrors, dielectric multilayer mirrors and metallic films.

4. Detector according to claim 3, characterized in that the second mirror (4) is chosen from the group consisting of a Bragg mirror and a dielectric multilayer mirror.

5. Detector according to claim 3, characterized in that the second mirror (4) comprises an air-resonant cavity interface.

6. Detector according to claim 1, characterized in that the detector comprises a set of resonant cavities with a matrix structure.

* * * * *